(12) United States Patent
von Malm

(10) Patent No.: US 9,343,642 B2
(45) Date of Patent: May 17, 2016

(54) OPTOELECTRONIC SEMICONDUCTOR CHIP

(75) Inventor: Norwin von Malm, Nittendorf (DE)

(73) Assignee: OSRAM Opto Semiconductor GmbH (DE)

( * ) Notice: Subject to any disclaimer, the term of this patent is extended or adjusted under 35 U.S.C. 154(b) by 122 days.

(21) Appl. No.: 14/009,265

(22) PCT Filed: Mar. 28, 2012

(86) PCT No.: PCT/EP2012/055555
§ 371 (c)(1),
(2), (4) Date: Nov. 20, 2013

(87) PCT Pub. No.: WO2012/130900
PCT Pub. Date: Oct. 4, 2012

(65) Prior Publication Data
US 2014/0061703 A1    Mar. 6, 2014

(30) Foreign Application Priority Data

Apr. 1, 2011    (DE) .......................... 10 2011 015 821

(51) Int. Cl.
*H01L 29/06*     (2006.01)
*H01L 31/00*     (2006.01)
(Continued)

(52) U.S. Cl.
CPC ............ *H01L 33/62* (2013.01); *H01L 25/0753* (2013.01); *H01L 31/02019* (2013.01);
(Continued)

(58) Field of Classification Search
CPC .................. H01L 2924/0002; H01L 2924/00; H01L 25/0753; H01L 27/153; H01L 2933/0016; H01L 31/02019; H01L 31/02327; H01L 31/20; H01L 31/382; H01L 31/405; H01L 31/44; H01L 31/60; H01L 31/62; H01L 33/60; H01L 33/62

USPC ........ 257/12, 13, 79, 93, 94, 99, 98, 432, 459
See application file for complete search history.

(56) References Cited

U.S. PATENT DOCUMENTS

2007/0096130 A1    5/2007  Schiaffino et al.
2011/0101390 A1*   5/2011  Engl et al. ...................... 257/93
(Continued)

FOREIGN PATENT DOCUMENTS

CN             1679177        10/2005
DE    10 2007 022 947 A1     10/2008
(Continued)

OTHER PUBLICATIONS

Compound Semiconductor: "Epistar's Chips Plug and Play," vol. 15, No. 4, 2009, p. 18.
(Continued)

*Primary Examiner* — Teresa M Arroyo
(74) *Attorney, Agent, or Firm* — DLA Piper LLP (US)

(57) ABSTRACT

An optoelectronic semiconductor chip includes a carrier including a carrier element having a mounting side; one electrically conductive n-type wiring layer arranged at the mounting side; a structured, electrically conductive contact layer having a p-side and n-side contact region and arranged at a side of the n-type wiring layer facing away from the carrier element; at least one insulation region electrically insulating the p-side contact region from the n-side contact region; at least one electrically insulating spacer layer arranged at a side of the n-type wiring layer facing away from the carrier element in a vertical direction between the p-side contact region and the n-type wiring layer, wherein the n-side contact region and the n-type wiring layer electrically conductively connect to one another, and the p-side contact region and the spacer layer border the n-side contact region in a lateral direction; an optoelectronic structure connected to the carrier.

12 Claims, 4 Drawing Sheets

(51) Int. Cl.
*H01L 27/15* (2006.01)
*H01L 29/26* (2006.01)
*H01L 31/12* (2006.01)
*H01L 33/00* (2010.01)
*H01L 29/207* (2006.01)
*H01L 31/0232* (2014.01)
*H01L 33/62* (2010.01)
*H01L 25/075* (2006.01)
*H01L 31/02* (2006.01)
*H01L 33/60* (2010.01)
*H01L 33/20* (2010.01)
*H01L 33/38* (2010.01)
*H01L 33/40* (2010.01)
*H01L 33/44* (2010.01)

(52) U.S. Cl.
CPC .......... *H01L31/02327* (2013.01); *H01L 33/60* (2013.01); *H01L 27/153* (2013.01); *H01L 33/20* (2013.01); *H01L 33/382* (2013.01); *H01L 33/405* (2013.01); *H01L 33/44* (2013.01); *H01L 2924/0002* (2013.01); *H01L 2933/0016* (2013.01)

(56) References Cited

U.S. PATENT DOCUMENTS

| | | | |
|---|---|---|---|
| 2013/0099272 A1* | 4/2013 | von Malm | 257/99 |
| 2013/0207154 A1* | 8/2013 | Hoppel | 257/99 |
| 2013/0221369 A1* | 8/2013 | Bergbauer et al. | 257/76 |
| 2014/0021507 A1* | 1/2014 | Engl et al. | 257/99 |
| 2014/0051194 A1* | 2/2014 | Herrmann et al. | 438/27 |
| 2014/0061702 A1* | 3/2014 | Yamamoto et al. | 257/98 |
| 2014/0283903 A1* | 9/2014 | von Malm et al. | 136/255 |
| 2014/0319547 A1* | 10/2014 | Rode et al. | 257/79 |
| 2014/0319566 A1* | 10/2014 | Perzlmaier et al. | 257/98 |
| 2014/0342484 A1* | 11/2014 | Hertkorn et al. | 438/46 |

FOREIGN PATENT DOCUMENTS

| | | |
|---|---|---|
| DE | 10 2008 011 848 A1 | 9/2009 |
| DE | 10 2008 016 525 A1 | 11/2009 |
| DE | 10 2008 051 050 A1 | 4/2010 |
| DE | 10 2009 030 243 A1 | 5/2010 |
| DE | 10 2009 010 480 A1 | 9/2010 |
| DE | 10 2009 037 186 A1 | 2/2011 |
| DE | 10 2010 013 494 A1 | 10/2011 |
| DE | 10 2010 048 159 A1 | 4/2012 |
| EP | 2 290 689 A2 | 3/2011 |
| JP | 2006-156583 | 6/2006 |
| JP | 2007-221141 | 8/2007 |
| JP | 2007-288097 | 11/2007 |
| JP | 2010-34487 | 2/2010 |
| JP | 2010-525585 | 7/2010 |
| JP | 2011-54967 | 3/2011 |
| WO | 2009/106063 A1 | 9/2009 |

OTHER PUBLICATIONS

English translation of a Japanese Examination Report dated Oct. 7, 2014 for Japanese Application No. 2014-501601.

English translation of Japanese Decision of Rejection dispatched Apr. 7, 2015 for corresponding Japanese Patent Application No. 2014-501601.

English translation of Chinese Search Report dated Jul. 16, 2015 from corresponding Chinese Application No. 2012800173122.

* cited by examiner

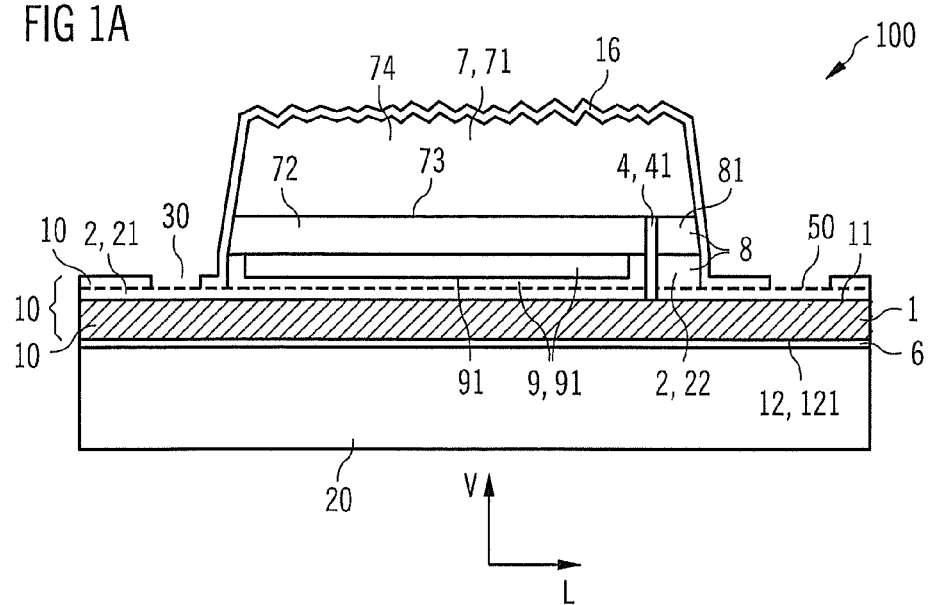
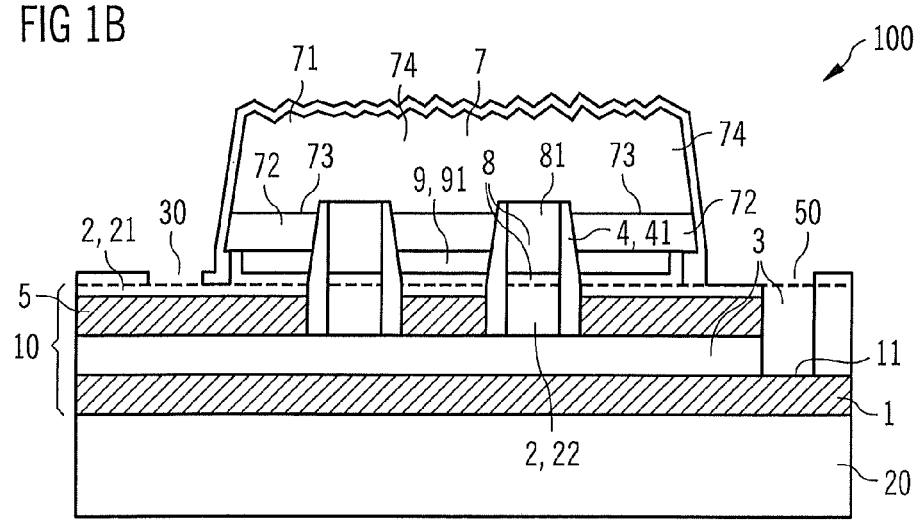

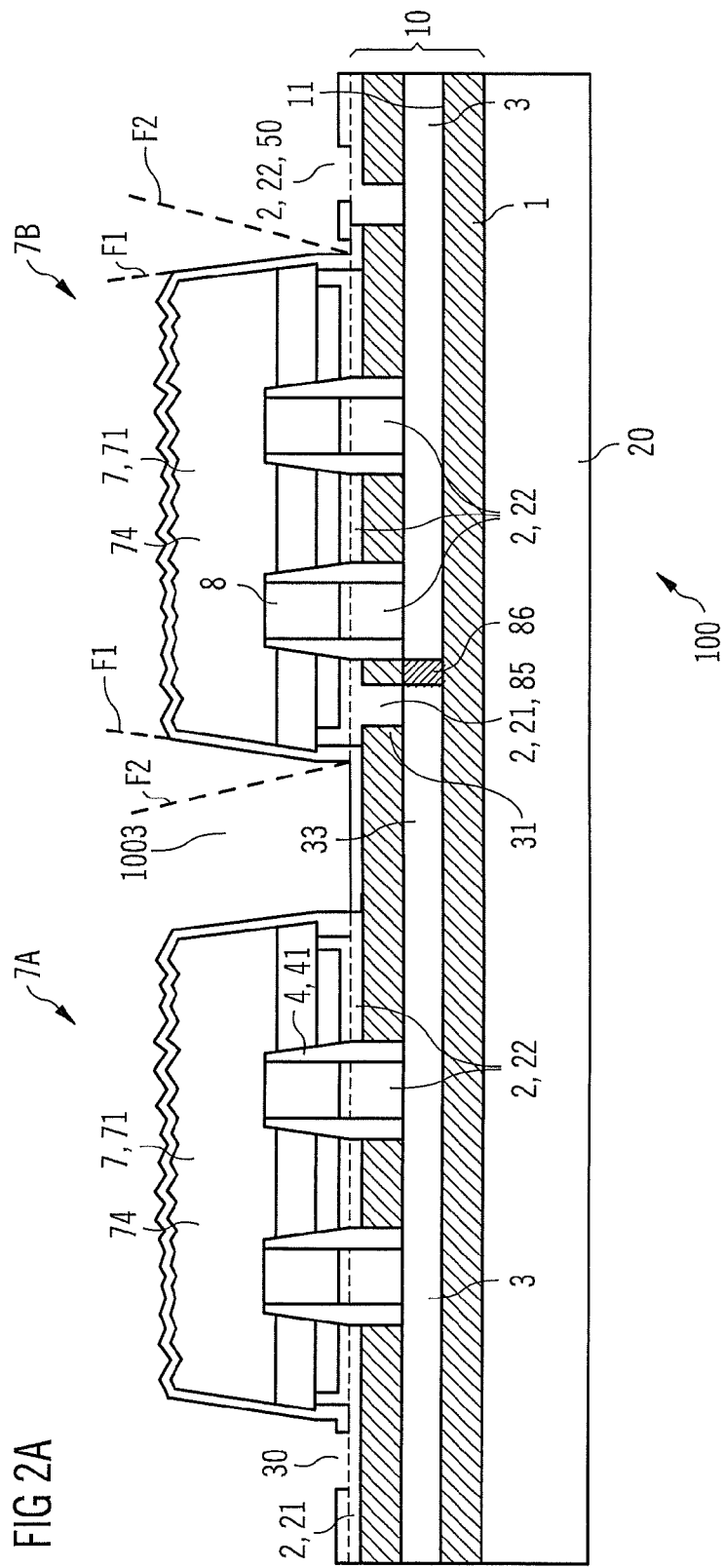

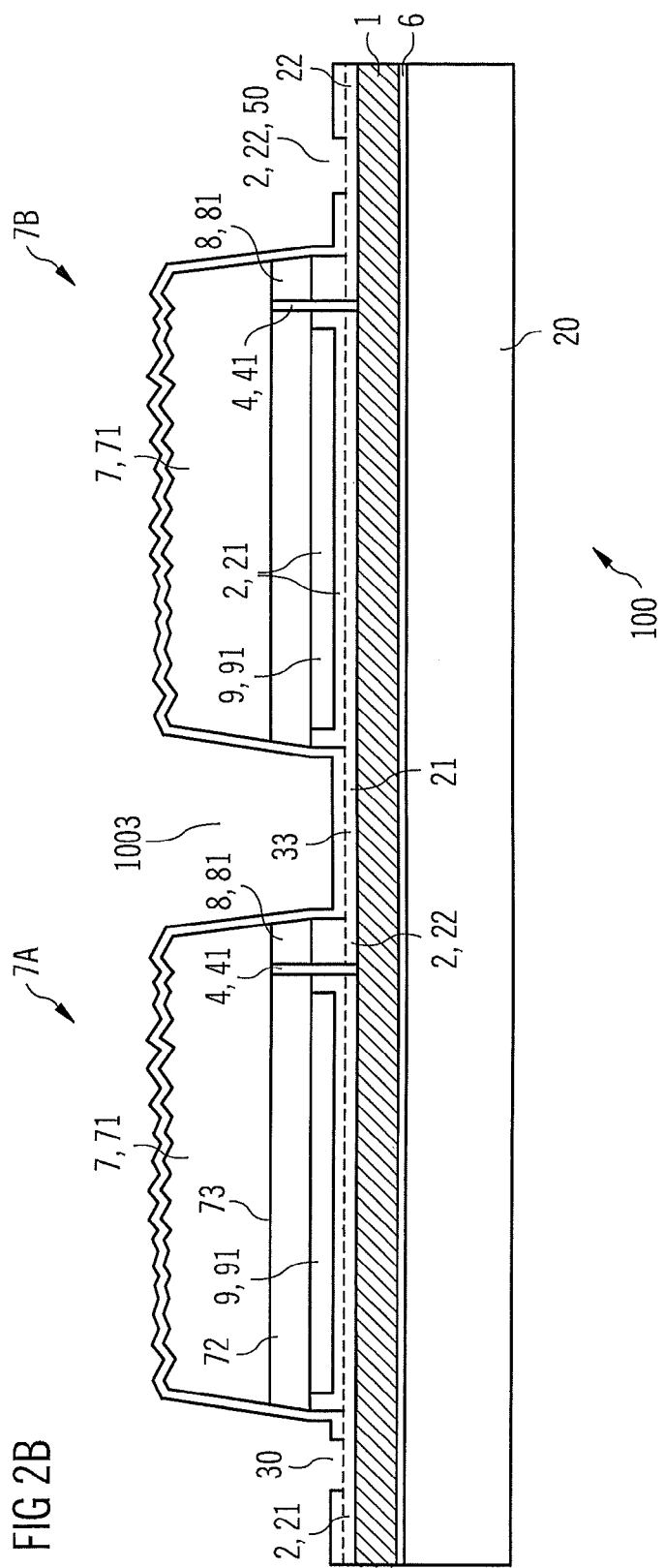

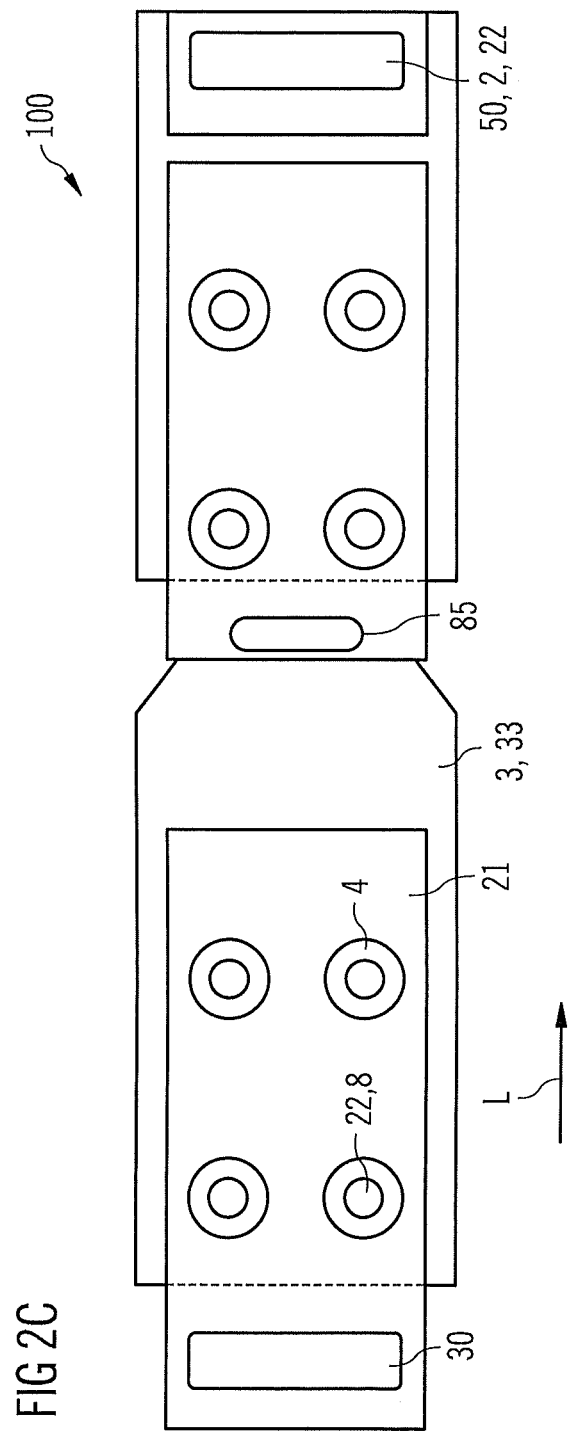

OPTOELECTRONIC SEMICONDUCTOR CHIP

TECHNICAL FIELD

This disclosure relates to an optoelectronic semiconductor chip.

BACKGROUND

There is a need to provide an optoelectronic semiconductor chip which is compact in terms of construction and stable in respect of aging.

SUMMARY

I provide an optoelectronic semiconductor chip including a carrier for an optoelectronic structure including an electrically insulating carrier element having a mounting side, at least one electrically conductive n-type wiring layer arranged at the mounting side, a structured, electrically conductive contact layer, which has at least one p-side contact region and at least one n-side contact region and is arranged at a side of the n-type wiring layer facing away from the carrier element, at least one insulation region which electrically insulates the p-side contact region from the n-side contact region, at least one electrically insulating spacer layer arranged at a side of the n-type wiring layer facing away from the carrier element in a vertical direction between the p-side contact region and the n-type wiring layer, wherein the n-side contact region and the n-type wiring layer electrically conductively connect to one another, and the p-side contact region and the spacer layer completely border the n-side contact region in a lateral direction, and at least one optoelectronic structure electrically conductively and mechanically fixedly connected to the carrier.

I also provide an optoelectronic semiconductor chip including a carrier for an optoelectronic structure including an electrically insulating carrier element having a mounting side, wherein the electrically insulating carrier element is a planar area at its side facing the optoelectronic structure and, on a side of the electrically insulating carrier element facing away from the optoelectronic structure, an auxiliary carrier is mechanically fixedly arranged at the electrically insulating carrier element, a structured, electrically conductive contact layer, which has at least one p-side contact region and at least one n-side contact region and is arranged at the mounting side of the carrier element, at least one insulation region which electrically insulates the p-side contact region from the n-side contact region, wherein the n-side contact region borders the p-side contact region in places in a lateral direction and at least one optoelectronic structure electrically conductively and mechanically fixedly connected to the carrier.

I further provide an optoelectronic semiconductor chip including a carrier for an optoelectronic structure including an electrically insulating carrier element having a mounting side, wherein the electrically insulating carrier element is a planar area at a side facing the optoelectronic structure and, on a side of the electrically insulating carrier element facing away from the optoelectronic structure, an auxiliary carrier is mechanically fixedly arranged at the electrically insulating carrier element, at least one electrically conductive n-type wiring layer arranged at the mounting side, a structured, electrically conductive contact layer which has at least one p-side contact region and at least one n-side contact region and is arranged at a side of the n-type wiring layer facing away from the carrier element, at least one insulating region which electrically insulates the p-side contact region from the n-side contact region, at least one electrically insulating spacer layer arranged at a side of the n-type wiring layer facing away from the carrier element in a vertical direction between the p-side contact region and the n-type wiring layer, wherein the n-side contact region and the n-type wiring layer electrically conductively connect to one another, and the p-side contact region and the spacer layer completely border the n-side contact region in a lateral direction and at least one optoelectronic structure electrically conductively and mechanically fixedly connected to the carrier.

BRIEF DESCRIPTION OF THE DRAWINGS

FIGS. 1A to 1B show in each case in schematic side and plan views one example of an optoelectronic semiconductor chip described herein.

FIGS. 2A to 2C show in each case in schematic side and plan views a second example of an optoelectronic semiconductor chip described herein.

DETAILED DESCRIPTION

Our optoelectronic semiconductor chip may comprise a carrier for an optoelectronic structure. The carrier can be formed with an electrically conductive or electrically insulating material.

At least one optoelectronic structure may be electrically conductively and mechanically fixedly connected to the carrier. In this context, "mechanically fixedly" means that the optoelectronic structure cannot be removed from the carrier, for example, by external mechanical forces without being destroyed. The optoelectronic structure can be, for example, a structure comprising a semiconductor layer sequence. The semiconductor layer sequence preferably comprises at least one active region suitable to generate and/or detect electromagnetic radiation during the operation of the optoelectronic structure. The carrier and the optoelectronic structure can together form an optoelectronic semiconductor chip which can then be, for example, a light-emitting diode chip or a photodiode chip.

The carrier may comprise an electrically insulating carrier element having a mounting side. By way of example, the optoelectronic structure is mechanically fixedly secured on an area at the mounting side of the carrier element. By way of example, the area is planar. In this case, the area has neither steps nor projections in a lateral and/or vertical direction within the scope of the production tolerance of the carrier element. In this case, "lateral direction" means a direction parallel to the main extension direction of the carrier element. "Vertical direction" is a direction perpendicular to the main extension direction of the carrier element.

The carrier may comprise an electrically conductive n-type wiring layer arranged at the mounting side. By way of example, the electrically conductive n-type wiring layer is applied on the area at the mounting side, for example, by printing and/or vapor deposition and/or litho-graphic processes. By way of example, the electrically conductive n-type wiring layer is formed with a metal and/or an electrically conductive adhesive. If the carrier is formed with an electrically conductive material, at least one electrically insulating intermediate layer is preferably arranged onto the area at the mounting side in a vertical direction between the n-type wiring layer and the carrier element. By way of example, the intermediate layer is formed with silicon dioxide, silicon nitride, aluminum oxide or contains at least one of the materials mentioned.

The carrier may comprise a structured, electrically conductive contact layer which has at least one p-side contact region and at least one n-side contact region. The electrically conductive contact layer is arranged at a side of the n-type wiring layer facing away from the carrier element. By way of example, the n-type wiring layer and the contact layer form in places external connection locations for the optoelectronic semiconductor chip. Preferably, the two contact regions are arranged alongside one another and at a distance from one another in a lateral direction. Via the connection locations, it is then possible, both via the electrically conductive contact layer and via the electrically conductive n-type wiring layer, for electric current to be distributed along the carrier or conducted to the desired locations.

The carrier may comprise at least one insulation region which electrically insulates the p-side contact region from the n-side contact region. By way of example, the insulation region interrupts the contact layer in a lateral direction such that no electric current can flow between the p-side contact region and n-side contact region.

The carrier may comprise at least one electrically insulating spacer layer arranged at a side of the n-type wiring layer facing away from the carrier element in a vertical direction between the p-side contact region and the n-type wiring layer. By way of example, the electrically insulating spacer layer is applied to an area at the side of the n-type wiring layer facing away from the carrier element, wherein the p-side contact region of the contact layer can in turn be applied on an area of the electrically insulating spacer layer facing away from the carrier element. That is to say that the electrically insulating spacer layer spaces apart the n-type wiring layer and the p-side contact region from one another in a vertical direction. Preferably, the spacer layer electrically insulates the p-side contact region and the n-type wiring layer from one another. In a lateral direction, the p-side contact region and the n-type wiring layer overlap at least in places.

The n-side contact region and the n-type wiring layer electrically conductively connect to one another. That is to say that the n-side contact region and the n-type wiring layer are at the same electrical potential. In the case of external electrical contact-connection, the n-type wiring layer preferably forms a cathode of the semiconductor chip, while the p-side contact region can form an anode of the semiconductor chip.

The p-side contact region and the spacer layer may completely border the n-side contact region in a lateral direction. In other words, the n-side contact region may be accessible only via the mounting side.

The optoelectronic semiconductor chip may comprise a carrier for an optoelectronic structure. The carrier may comprise a carrier element having a mounting side and also at least one electrically conductive n-type wiring layer arranged at the mounting side. Furthermore, the carrier comprises a structured, electrically conductive contact layer which has at least one p-side contact region and at least one n-side contact region and is arranged at a side of the n-type wiring layer facing away from the carrier element. Moreover, the carrier comprises at least one insulation region which electrically insulates the p-side contact region from the n-side contact region, and also at least one electrically insulating spacer layer arranged at a side of the n-type wiring layer facing away from the carrier element in a vertical direction between the p-side contact region and the n-type wiring layer. In this case, the n-side contact region and the n-type wiring layer electrically conductively connect to one another, wherein the p-side contact region and the spacer layer completely border the n-side contact region in a lateral direction. Furthermore, the optoelectronic semiconductor chip comprises at least one optoelectronic structure electrically conductively and mechanically fixedly connected to the carrier.

The optoelectronic semiconductor chip described here is based on the insight, inter alia, that when contact-connecting an optoelectronic structure to a carrier it is often necessary to avoid an electrical short circuit between the optoelectronic structure and the carrier to apply an electrical insulation between the optoelectronic structure and the carrier, but the electrical insulation, in terms of its structure, should be free of defects, that is to say without holes or unevennesses. A defect-free electrical insulation makes it possible to avoid current leaks in the electrical insulation. However, after relatively long operation of the optoelectronic semiconductor chip, such electrical insulations can have or develop cracks and fractures which can give rise to electrical short circuits between the carrier and the optoelectronic structure.

Thus, to provide a compact and aging-stable optoelectronic semiconductor chip, the optoelectronic semiconductor chip described here is based on the concept, inter alia, of forming a contact-connection of an optoelectronic structure which is electrically conductively and mechanically fixedly applied on a carrier, on the carrier instead of in the optoelectronic structure itself. In other words, such a carrier, to contact the optoelectronic structure in an electrically functioning manner, already has corresponding connection locations and contact regions such that, for example, the optoelectronic structure need only be electrically conductively and mechanically fixedly arranged with its contact elements on contact regions of the carrier assigned to the contact elements. That is to say that it is possible to dispense with time-consuming contact-connection methods which are complex, for example, in a process of manufacturing the optoelectronic semiconductor chip within the optoelectronic structure. Moreover, by the contact-connection proposed here, it is possible to dispense with such a complex electrical insulation since the optoelectronic structure can be placed conclusively and mechanically fixedly with its contact elements on the contact regions of the carrier.

Alternatively or additionally, we provide an optoelectronic semiconductor chip wherein the n-type wiring layer and the electrically insulating spacer layer are dispensed with. Instead, the n-side contact region borders the p-side contact region only in places in a lateral direction. In particular, this means that the p-side contact region is not completely bordered, that is to say not completely enclosed, by the n-side contact region in a lateral direction. In other words, in contrast to the previous structure, the n-side contact region is arranged on the outside with respect to the p-side contact region in a lateral direction. In this context, "on the outside" means that in a lateral direction at a distance from the semiconductor chip the n-side contact region borders the p-side contact region in places. In such an example of the carrier as well, the carrier therefore itself has the contact regions, as a result of which it is possible to dispense with a complex contact-connection of the optoelectronic structure to the carrier.

The carrier may comprise at least one mirror layer arranged at a bearing side of the carrier element, the bearing side situated opposite the mounting side, and substantially completely covering an area at the bearing side. In this case, "substantially" means that the mirror layer covers at least 80%, in particular more than 90%, of the area at the bearing side. The mirror layer reflects electromagnetic radiation primarily generated within the active region of the semiconductor layer sequence of the optoelectronic structure in the direction of a radiation coupling-out area, that is to say away from the carrier element, and thus increases the proportion of electromagnetic radiation coupled out from the semiconductor chip with respect to electromagnetic radiation primarily generated within the active region. In this case, the radiation coupling-out area is that area of the optoelectronic structure through which electromagnetic radiation primarily generated within the optoelectronic structure leaves the semiconductor chip. Preferably, the carrier element is radiation-transmissive at least in places. That is to say that at these places the carrier element is transmissive at least to the extent of 80%, preferably to the extent of more than 90%, to electromagnetic radiation emitted by the active region in the direction of the carrier element. Advantageously, the highest possible proportion of the electromagnetic radiation emitted by the active region can thus impinge on the mirror layer, instead of being absorbed by the carrier element.

The insulation region may be formed with at least one cavity at least in places. That is to say that the insulation region is formed by at least one cutout and/or recess in the region of the at least one cavity. The cavity is free of the material of the electrically conductive contact layer and the material of the carrier element. By way of example, the cavity is filled with air and/or some other gas. Such a cavity leads to a stable electrical insulation between the p-side contact region and the n-side contact region, which can also be produced cost-effectively.

The cavity may be filled at least in places with at least one of the materials plastic, resin, silicon dioxide, silicon nitride, aluminum oxide, titanium dioxide. Depending on material selection and/or degree of filling of the cavity, the insulation region can have different electrically insulating and thermally conductive properties which can be set in a predefinable manner.

The optoelectronic structure may comprise the following components: the optoelectronic structure comprises a semiconductor layer sequence having at least one n-conducting region and at least one p-conducting region and also at least one active region arranged between the two regions in a vertical direction. The active region is provided to generate or detect the electromagnetic radiation during operation of the optoelectronic semiconductor chip. The semiconductor layer sequence can be based, for example, on a III-V compound semiconductor material. In this context, "n-conducting region" and "p-conducting region" mean that the semiconductor layer sequence has regions which are "n-" or "p-conducting" with regard to their electrical conductivity.

The optoelectronic structure may comprise at least one n-type contact element, via which the n-conducting region can be electrically contact-connected through the p-conducting region. In other words, the n-conducting region electrically contact-connects through the p-conducting region, that is to say from the p-type side of the semiconductor layer sequence. The n-type contact element can be a contact element which, for example, extends in an uninterrupted manner and continuously within the semiconductor layer sequence and directly adjoins the semiconductor material of the semiconductor layer sequence at least in places.

The optoelectronic structure may comprise at least one p-type contact element, via which the p-conducting region can be electrically contact-connected. In this case, the p-type contact element and the n-type contact element are electrically insulated from one another by the insulation region. In this case, the insulation region can extend into the optoelectronic structure continuously and in an uninterrupted manner, proceeding from the carrier.

The n-type contact element electrically conductively connects to the n-side contact region and the p-type contact element electrically conductively connects to the p-side contact region of the carrier element. By way of example, the optoelectronic structure is arranged on the carrier such that the two contact elements of the optoelectronic structure are congruent at least in places with the contact regions of the carrier which are respectively assigned to the contact elements. For this purpose, the optoelectronic structure can be placed onto the carrier and electrically conductively and mechanically fixedly connected thereto.

The n-type contact element may bound the p-conducting region laterally at least in places. By way of example, the n-type contact element borders the p-conducting region at least in places. It is likewise conceivable for the n-type contact element to bound the p-conducting region on all sides in a lateral direction. In a plan view of the semiconductor chip, the n-type contact element is "circumferentially extending" and forms an uninterrupted zone.

The n-type contact element may be arranged in a perforation in the semiconductor layer sequence, wherein the perforation extends into the n-conducting region completely through the p-conducting region in a vertical direction, proceeding from the carrier. Preferably, in a lateral direction the insulation region is arranged within the perforation between the semiconductor material of the semiconductor layer sequence and the n-type contact element. In this case, the p-conducting region bounds the n-type contact element on all sides in a lateral direction.

The semiconductor layer sequence may be free of a growth substrate. In this context, "free of a growth substrate" means that the semiconductor layer sequence which is grown epitaxially, for example, can be deposited on such a growth substrate, the growth substrate being removed from the semiconductor layer sequence after epitaxial deposition has taken place.

Alternatively, the growth substrate can also be a part of the semiconductor layer sequence or remain arranged on the semiconductor layer sequence.

The p-type contact element may be formed with a p-side mirror element and the n-type contact element is formed with an n-side mirror element. The two mirror elements are electrically insulated from one another by the at least one insulation region, and the mirror elements are provided to reflect electromagnetic radiation generated in the active region. In this case, p-side mirror element and n-side mirror element mean that the mirror elements are respectively assigned to at least one p-type contact element and one n-type contact element, for example, assigned uniquely or one-to-one. Preferably, the p-side mirror element and the n-side mirror element are electrically conductive. By way of example, the p-side mirror element and the n-side mirror element are in direct contact with the n-conducting region and p-conducting region of the semiconductor layer sequence that are assigned to the element. In other words, the mirror elements can be in direct contact with the conductive regions of the semiconductor layer sequence that are assigned to them, and can make electrically conductive contact with them.

The n-type wiring layer may be formed with at least one mirror element or at least one mirror element, for example, an n-type mirror element is arranged between the n-type wiring layer and the semiconductor layer sequence in a vertical direction. In particular, the mirror element can be arranged below the insulation region in a vertical direction and can then reflect, for example, electromagnetic radiation impinging from the optoelectronic structure in the direction of the carrier, that is to say through the insulation region and on the n-type mirror element, back in the direction of the optoelectronic structure.

The insulation region may extend in a vertical direction proceeding from the n-side contact region of the carrier through the electrically insulating spacer layer right into the n-conducting region of the semiconductor layer sequence. In this case, the insulation region borders both the n-type contact element and the n-side contact region on all sides in a lateral direction.

At a side of the carrier element which faces away from the optoelectronic structure, an auxiliary carrier may be mechanically fixedly arranged at a carrier element, wherein the auxiliary carrier is formed with at least one of the materials silicon oxide, aluminum oxide, silicon nitride, aluminum nitride, silicon, germanium, gallium arsenide, silicon carbide, sapphire, metal or contain at least one of the materials mentioned. The metals can be nickel, molybdenum, tungsten, copper or a high-grade steel. In other words, the carrier is then arranged between the optoelectronic structure and the auxiliary carrier in a vertical direction.

The p-side contact region and the n-side contact region and/or the n-type wiring layer may be led away from the optoelectronic structure in a lateral direction. In other words, the optoelectronic structure can be electrically contact-connected "laterally" via the contact regions and/or the n-type wiring layer. In other words, the contact regions and/or the n-type wiring layer can form external electrical connection locations for the optoelectronic semiconductor chip.

The carrier element may be radiation-transmissive at least to electromagnetic radiation emitted by the optoelectronic structure. By way of example, the auxiliary carrier is then reflective to electromagnetic radiation which passes through the carrier element and impinges on the auxiliary carrier. In this case, the auxiliary carrier can reflect the impinging electromagnetic radiation back in the direction of the optoelectronic structure.

The optoelectronic semiconductor chip may comprise at least optoelectronic structures. In this case, the optoelectronic structures are arranged on the same side of the carrier and alongside one another in a lateral direction on the carrier.

The optoelectronic structures may electrically contact-connect to one another in a series circuit. What is thus achieved is that the optoelectronic semiconductor chip has a significantly lower current flow for predefinable brightness in operation. By way of example, the optoelectronic semiconductor chip can be fed in a voltage-driven manner in the case of simultaneous direct currents. As a result, by way of example, expensive driver stages and high-current sources can be replaced by corresponding high-voltage sources which are easy to manufacture.

The n-conducting region of an optoelectronic structure may electrically conductively connect to the p-conducting region of an adjacent optoelectronic structure via a continuous intermediate contact layer.

The intermediate contact layer is formed either at least in places by the n-type wiring layer assigned to an optoelectronic structure and by a p-type wiring layer assigned to an adjacent optoelectronic structure or by the n-side contact region assigned to an optoelectronic structure and by the p-side contact region assigned to an adjacent optoelectronic structure. In this case, the p-type wiring layer is arranged in the carrier and electrically conductively connected to the p-side contact region of the carrier in the same way as the n-type wiring layer. In other words, the contact regions and/or the wiring layers are "connected" together to form an intermediate contact layer, such that, by the intermediate contact layer, an n-conducting region is at the same electrical potential as the p-conducting region adjacent to the n-conducting region.

The optoelectronic semiconductor chip described here is explained in greater detail below on the basis of examples and the associated figures.

In the examples and the figures, identical or identically acting component parts are in each case provided with the same reference signs. The elements illustrated should not be regarded as true to scale; rather, individual elements may be illustrated with an exaggerated size to afford a better understanding.

FIG. 1A shows, on the basis of a schematic side view, an optoelectronic semiconductor chip 100 described here, comprising a carrier 10. The carrier 10 comprises an electrically insulating carrier element 1 having a mounting side 11. In particular, the carrier element 1 can be radiation-transmissive. By way of example, the carrier element 1 is formed with at least one electrically insulating material such as, for example, with one of the materials aluminum oxide, aluminum nitride, silicon oxide, silicon nitride, titanium dioxide, sapphire, or contains at least one of the materials mentioned.

Moreover, the carrier 10 comprises a structured, electrically conductive contact layer 2 which has at least one p-side contact region 21 and at least one n-side contact region 22. In this case, the electrically conductive contact layer 2 is arranged on an area at the mounting side 11 of the carrier element 1. In particular, the electrically conductive contact layer 2 can be formed with a metal, which can be sputtered and/or vapor-deposited, for example, onto the carrier element 1.

Furthermore, in the example in accordance with FIG. 1A, the carrier 10 comprises an insulation region 4, which electrically insulates the p-side contact region 21 from the n-side contact region 22. In this case, the insulation region 4 is formed with a cavity 41, which can be completely or partly filled with at least one electrically insulating material, for example, a plastic, resin, silicon dioxide, aluminum oxide, or titanium dioxide. Furthermore, a mirror layer 6 is applied on a bearing side 12 of the carrier element 1, the bearing side being situated opposite the mounting side 11, on an area 12A of the bearing side 12, the mirror layer completely covering the area 12A. Furthermore, the n-side contact region 21 borders the p-side contact region 22 in places in a lateral direction L.

Furthermore, the optoelectronic semiconductor chip comprises an optoelectronic structure 7 electrically conductively and mechanically fixedly connected to the carrier 10. The optoelectronic structure 7 comprises a semiconductor layer sequence 71 having at least one n-conducting region 74 and at least one p-conducting regions 72 and also at least one active region 73 arranged between the two regions 72 and 74 in a vertical direction V. In this case, the semiconductor layer sequence 71 is free of a growth substrate. The active region 73 emits electromagnetic radiation during the operation of the optoelectronic semiconductor chip 100. Furthermore, the optoelectronic structure 7 comprises an n-type contact element 8, via which the n-conducting region 74 can be electrically contact-connected through the p-conducting region 72. Furthermore, the optoelectronic structure 7 comprises a p-type contact element 9, via which the p-conducting region 72 can be electrically contact-connected. In other words, the n-type contact element 8 and the p-type contact element 9 form connection locations of the optoelectronic structure 7 via which the optoelectronic structure is electrically conductively and mechanically fixedly connected to the carrier 1.

Furthermore, the p-type contact element 9 has a p-side mirror element 91 and the n-type contact element 8 has an n-side mirror element 81. The two mirror elements 91 and 81 are electrically insulated from one another by the insulation region 4, the mirror elements 81 and 91 being provided, inter alia, for reflecting electromagnetic radiation generated within the active region.

Furthermore, it can be gathered from FIG. 1A that the n-type contact element 8 bounds the p-conducting region 72 in places in a lateral direction L. In other words, in accordance with FIG. 1A, the n-conducting region 74 electrically conductively contact-connects by the n-type contact element 8 from a lateral direction L, that is to say laterally. In this case, the insulation region 4 runs through the p-conducting regions 72 in a vertical direction V, proceeding from the n-side contact region 22 of the carrier 10.

The p-side contact region 21 and the n-side contact region 22 are arranged alongside one another in a lateral direction L. Furthermore, the p-side contact region 21 and the n-side contact region 22 are led away from the opto electronic structure 7 in a lateral direction L. In other words, the p-side contact region 21 and the n-side contact region 22 can be electrically contact-connected "laterally" from outside. Moreover, at least one passivation layer 16 is applied on exposed locations of the contact regions 21 and 22 and also on exposed locations of the optoelectronic structure 7, wherein external connection locations 30 and 50 of the optoelectronic semiconductor chip 100 are formed at locations of the contact regions 21 and 22 which are free of the passivation layer 16. The passivation layer 16 can be formed with an electrically insulating material, for example, silicon dioxide and/or aluminum oxide. By way of example, the connection location 30 forms an anode and the connection location 50 forms a cathode of the optoelectronic semiconductor chip 100.

On a side of the carrier element 1 facing away from the optoelectronic structure 7, an auxiliary carrier 20 is mechanically fixedly arranged at the carrier element 1, wherein the auxiliary carrier 20 is formed with at least one of the materials aluminum oxide, silicon nitride, aluminum nitride, silicon, germanium, gallium arsenide, silicon carbide, sapphire, metal or contains at least one of the materials mentioned.

FIG. 1B shows, in a schematic side view, a further example of an optoelectronic semiconductor chip 100 described here. In this case, once again the p-side contact region 21 and the n-side contact region 22 are arranged alongside one another in a lateral direction L. In contrast to the example in accordance with FIG. 1A, however, the example in accordance with FIG. 1B additionally comprises at least one electrically conductive n-type wiring layer 3 arranged at the mounting side 11. In this case, the n-type wiring layer 3 is directly applied to an area facing away from the auxiliary carrier 20 at the mounting side 11 of the carrier element 1.

Furthermore, an electrically insulating spacer layer 5 is arranged at a side of the n-type wiring layer 3 which faces away from the carrier element 1 in a vertical direction V between the p-side contact region 21 and the n-type wiring layer 3, wherein the n-side contact region 22 and the n-type wiring layer 3 electrically conductively connect to one another. The spacer layer 5 spaces apart the p-side contact region 21 and the n-type wiring layer 3 from one another in a vertical direction V and electrically insulates them from one another. In other words, in a vertical direction V, the n-type wiring layer is led below the p-side contact region 21 at least in places.

In contrast, however, to the example in accordance with FIG. 1A, in the example in accordance with FIG. 1B, the external connection location 50 is formed by the n-type wiring layer 3. In other words, instead of the n-side contact region 22, the n-type wiring layer 3 is laterally led away from the optoelectronic structure 7 and forms the external connection location 50 at exposed locations.

Furthermore, in contrast to the example in accordance with FIG. 1A, in FIG. 1B the n-type contact element 8 is formed by at least one perforation in the p-conducting region 72. That is to say that the n-conducting region 74 electrically conductively contact-connects from below and on the p-side. In this case, the insulation region 4 extends in a vertical direction V proceeding from the n-type wiring layer 3 through the electrically insulating spacer layer 5 and the p-conducting region 72 right into the n-conducting region 74. The insulation region 4 therefore completely borders the n-type contact elements 8 in a lateral direction L.

In this context, it should furthermore be noted that the remaining features of the optoelectronic semiconductor chip 100 in accordance with FIG. 1B have already been described and disclosed in connection with the example of the optoelectronic semiconductor chip 100 in accordance with FIG. 1A.

FIG. 2A shows, in a schematic side view, a further example of an optoelectronic semiconductor chip 100 described here. In this case, the optoelectronic semiconductor chip 100 comprises the carrier 10 in accordance with the example described in FIG. 1B. On the carrier 10, two optoelectronic structures 7 arranged alongside one another in a lateral direction L are electrically conductively and mechanically fixedly connected to the carrier 10. To afford a better understanding, the optoelectronic structure 7 illustrated on the left shall be referred to hereinafter as a first optoelectronic structure 7A, and the optoelectronic structure 7 illustrated on the right shall be referred to hereinafter as a second optoelectronic structure 7B. The two optoelectronic structures 7A and 7B electrically contact-connect to one another in a series circuit and are separated from one another by a trench 1003. The n-conducting region 74 of the first optoelectronic structure 7A electrically conductively connects to the p-conducting region 72 of the second optoelectronic structure 7B via a continuous intermediate contact layer 33.

In this case, the intermediate contact layer 33 is formed completely by the n-type wiring layer 3 assigned to the first optoelectronic structure 7A and by a p-type wiring layer 31 assigned to the second optoelectronic structure 7B. In other words, the two wiring layers 3 and 31 connect to one another to form a common intermediate contact layer 33. Therefore, the wiring layers 3 and 31 and the intermediate contact layer 33 do not overlap. An n-type wiring layer 3 is uniquely assigned to each optoelectronic structure 7. In a lateral direction L between in each case an n-type wiring layer 3 and a p-type wiring layer 31, a contact interruption 86 is arranged between them. The contact interruption 86 insulates from one another wiring layers that are in each case adjacent in a lateral direction L. At least one electrically insulating material is arranged in the contact interruption 86. By way of example, this is the material with which the carrier element 1 is formed, or a material that differs therefrom, for example, a polymer, in particular a BCB, or a sol-gel material. Moreover, as already described in FIG. 1B, the passivation layer 16 is applied to exposed locations of the optoelectronic semiconductor chip 100.

Furthermore, electrical voltage and/or current taps can be arranged between the two optoelectronic structures 7 in a lateral direction L, with which taps each of the optoelectronic structures 7 can be driven and electrically operated separately and independently of one another.

Furthermore, the trench 1003 can be formed between the first optoelectronic structure 7A and the second optoelectronic structure 7B from the direction of the p-conducting region 72. If the trench 1003 is formed from the direction of the p-conducting region 72 before the mechanical connection of the optoelectronic structures 7 to the carrier 10, then a chip-to-wafer transfer is conceivable alongside the wafer-to-wafer transfer illustrated in FIG. 2A. In the case where the trench 1003 is formed from the direction of the p-conducting region 72, flanks F2 in the optoelectronic structures 7, such as are depicted schematically in FIG. 2A, can be detected. The flanks F1 which can be detected in the case where the trench 1003 is formed from the direction of the n-conducting region 74 are depicted schematically in FIG. 2A. The formation of the trench 1003 from the direction of the p-conducting region 72 and from the direction of the n-conducting region 74 can be effected by etching. In this case, the flanks F2 of the optoelectronic structures 7 form an angle with respect to the mounting side 11 of the carrier 1, wherein the angle is greater than 90°. The flanks F1 of the optoelectronic structures 7 form an angle with respect to the mounting side 11 of the carrier 1, wherein the angle is less than 90°. In other words, the flanks F2 have an inverse inclination with respect to the flanks F1.

FIG. 2B shows, in a side view, a further example of an optoelectronic semiconductor chip 100 described here, comprising a carrier 10 in accordance with the example in FIG. 1A. In this case, the series connection of the two optoelectronic structures 7 is once again effected by the intermediate contact layer 33, in which case, in contrast to the example in accordance with FIG. 2A, the intermediate contact layer 33 is formed by the n-side contact region 22 assigned to the optoelectronic structure 7A and by the p-side contact region 21 assigned to the optoelectronic structure 7B.

FIG. 2C shows, in a schematic plan view, the example of the optoelectronic semiconductor chip 100 in accordance with FIG. 2A. The plan view once again reveals the external connection locations 30 and 50 formed by the p-side contact region 21 and the n-side contact region 22. Moreover, FIG. 2C reveals that, by a recess 85 in the electrically insulating spacer layer 5, the p-side contact region 21 electrically conductively connects to the intermediate contact layer 33, as a result of which the series connection of the two optoelectronic structures 7 is produced. Moreover, it can be discerned that the insulation region 4 borders both the n-side contact region 22 of the carrier 10 and the n-type contact element 8 of the optoelectronic structure 7 on all sides in a lateral direction L and electrically insulates them from the p-conducting region 72 of the semiconductor layer sequences 71.

Our chips and methods are not restricted by the description on the basis of the examples. Rather, this disclosure encompasses any novel feature and also any combination of features, which in particular includes any combination of features in the appended claims, even if the feature or combination itself is not explicitly specified in the claims or the examples.

The invention claimed is:

1. An optoelectronic semiconductor chip comprising:
an optoelectronic structure;
a carrier for the optoelectronic structure comprising:
an electrically insulating carrier element having a mounting side and is a planar area at a side facing the optoelectronic structure, wherein the planar area extends along a whole lateral extent of the optoelectronic structure and has neither steps nor projections in a lateral and vertical direction; and on a side of the electrically insulating carrier element facing away from the optoelectronic structure, an auxiliary carrier is mechanically fixedly attached to the electrically insulating carrier element;
at least one electrically conductive n-type wiring layer arranged at the mounting side;
a structured, electrically conductive contact layer, which has at least one p-side contact region and at least one n-side contact region and which is arranged at a side of the n-type wiring layer facing away from the electrically insulating carrier element so that the contact regions terminate flush with a top side of the carrier;
at least one insulation region which electrically insulates the p-side contact region from the n-side contact region;
at least one electrically insulating spacer layer arranged at a side of the n-type wiring layer facing away from the electrically insulating carrier element in a vertical direction, extending perpendicular to the top side, between the p-side contact region and the n-type wiring layer, wherein
the n-side contact region and the n-type wiring layer electrically conductively connected to one another;
the p-side contact region and the spacer layer completely border the n-side contact region in a lateral direction;
the optoelectronic structure comprises contact elements electrically connected to the optoelectronic structure, the contact elements being different components from the contact regions and terminating flush with a backside of the optoelectronic structure;
the optoelectronic structure is disposed conclusively and mechanically fixedly with its backside on the top side of the carrier;
the contact elements are disposed on the contact regions of the carrier and electrically connected to the contact regions; and
in the vertical direction, the contact elements and the contact regions are not formed from one single piece.

2. The optoelectronic semiconductor chip according to claim 1, further comprising at least one mirror layer arranged at a bearing side of the electrically insulating carrier element, said bearing side being situated opposite the mounting side, and substantially completely covers an area at the bearing side.

3. The optoelectronic semiconductor chip according to claim 1, wherein the insulation region is formed with at least one cavity at least in places.

4. The optoelectronic semiconductor chip according to claim 3, wherein the cavity is filled at least in places with at least one material selected from the group consisting of plastic, resin, silicon dioxide, silicon nitride, aluminum oxide and titanium dioxide.

5. The optoelectronic semiconductor chip according to claim 1, wherein the optoelectronic structure comprises:
a semiconductor layer sequence having at least one n-conducting region, at least one p-conducting region and at least one active region arranged between the two regions in a vertical direction;
at least one n-type contact element, via which the n-conducting region is electrically contact-connected through the p-conducting region; and
at least one p-type contact element, via which the p-conducting region is electrically contact-connected,
wherein
the n-type contact element electrically conductively connected to the n-side contact region and the p-type contact element is electrically conductively connected to the p-side contact region of the electrically insulating carrier element.

6. The optoelectronic semiconductor chip according to claim 5, wherein the semiconductor layer sequence is free of a growth substrate.

7. The optoelectronic semiconductor chip according to claim 5, wherein the p-type contact element is formed with a p-side mirror element and the n-type contact element is formed with an n-side mirror element, the two mirror elements are electrically insulated from one another by the at least one insulation region, and the mirror elements reflect electromagnetic radiation generated in the active region.

8. The optoelectronic semiconductor chip according to claim 5, wherein the insulation region extends in a vertical direction proceeding from the n-side contact region of the carrier through the electrically insulating spacer layer right into the n-conducting region of the semiconductor layer sequence, and the insulation region borders both the n-type contact element and the n-side contact region on all sides in a lateral direction.

9. The optoelectronic semiconductor chip according to claim 1, wherein the p-side contact region and the n-side contact region and/or the n-type wiring layer are connected to the optoelectronic structure in a lateral direction.

10. The optoelectronic semiconductor chip according to claim 1, further comprising:
at least two optoelectronic structures, wherein
the at least two optoelectronic structures are electrically contact-connected to one another another in a series circuit.

11. The optoelectronic semiconductor chip according to claim 10, wherein
the n-conducting region of one of the at least two optoelectronic structures is electrically conductively connected to the p-conducting region of an adjacent optoelectronic structure via a continuous intermediate contact layer, wherein
the intermediate contact layer is formed either at least in places:
by the n-type wiring layer assigned to an optoelectronic structure, and by a p-type wiring layer assigned to an adjacent optoelectronic structure, or
by the n-side contact region assigned to an optoelectronic structure, and by the p-side contact region assigned to an adjacent optoelectronic structure.

12. An optoelectronic semiconductor chip comprising:
an optoelectronic structure;
a carrier for the optoelectronic structure comprising:
an electrically insulating carrier element having a mounting side, wherein
the electrically insulating carrier element is a planar area at a side facing the optoelectronic structure, wherein the planar area extends along a whole lateral extent of the optoelectronic structure and has neither steps nor projections in a lateral and vertical direction; and on a side of the electrically insulating carrier element facing away from the optoelectronic structure, an auxiliary carrier is mechanically fixedly attached to the electrically insulating carrier element,
at least one electrically conductive n-type wiring layer arranged at the mounting side;
a structured, electrically conductive contact layer which has at least one p-side contact region and at least one n-side contact region and which is arranged at a side of the n-type wiring layer facing away from the electrically insulating carrier element so that the contact regions terminate flush with a top side of the carrier;
at least one insulating region which electrically insulates the p-side contact region from the n-side contact region;
at least one electrically insulating spacer layer arranged at a side of the n-type wiring layer facing away from the electrically insulating carrier element in a vertical direction, extending perpendicular to the top side, between the p-side contact region and the n-type wiring layer, wherein
the n-side contact region and the n-type wiring layer are electrically onductively connected to one another;
the p-side contact region and the spacer layer completely border the n-side contact region in a lateral direction;
the optoelectronic structure comprises contact elements electrically connected to the optoelectronic structure, the contact elements being different components from the contact regions and terminating flush with a backside of the optoelectronic structure;
the optoelectronic structure is disposed conclusively and mechanically fixedly with its backside on the top side of the carrier;
the contact elements are disposed on the contact regions of the carrier and electrically connected to the contact regions;
in the vertical direction the contact elements and the contact regions are not formed from one single piece; and
the insulation region is formed with at least one cavity filled with at least air and/or some other gas.

* * * * *